(12) United States Patent
Tu et al.

(10) Patent No.: US 10,164,142 B2
(45) Date of Patent: Dec. 25, 2018

(54) FLIP CHIP LIGHT EMITTING DIODE AND METHOD OF MANUFACTURING THE SAME

(71) Applicants: ADVANCED OPTOELECTRONIC TECHNOLOGY, INC., Hsinchu Hsien (TW); INNOLUX CORPORATION, Miao-Li County (TW)

(72) Inventors: Po-Min Tu, Hsinchu (TW); Chien-Shiang Huang, Hsinchu (TW); Chien-Chung Peng, Hsinchu (TW); Tzu-Chien Hung, Hsinchu (TW); Shih-Cheng Huang, Hsinchu (TW); Chang-Ho Chen, Hsinchu (TW); Tsau-Hua Hsieh, Hsinchu (TW); Jong-Jan Lee, Osaka (JP); Paul-John Schuele, Osaka (JP)

(73) Assignees: ADVANCED OPTOELECTRONIC TECHNOLOGY, INC., Hsinchu Hsien (TW); Innolux Corporation, Miao-Li County (TW)

( * ) Notice: Subject to any disclaimer, the term of this patent is extended or adjusted under 35 U.S.C. 154(b) by 0 days.

(21) Appl. No.: 15/634,997

(22) Filed: Jun. 27, 2017

(65) Prior Publication Data
US 2018/0212105 A1 Jul. 26, 2018

(30) Foreign Application Priority Data
Jan. 20, 2017 (CN) .......................... 2017 1 0049601

(51) Int. Cl.
*H01L 33/00* (2010.01)
*H01L 33/44* (2010.01)
(Continued)

(52) U.S. Cl.
CPC .......... *H01L 33/00* (2013.01); *H01L 33/0079* (2013.01); *H01L 33/24* (2013.01);
(Continued)

(58) Field of Classification Search
CPC ......... H01L 33/38; H01L 33/24; H01L 33/44; H01L 33/12
(Continued)

(56) References Cited

U.S. PATENT DOCUMENTS

| 9,691,944 B2* | 6/2017 | Jeon ......................... H01L 33/46 |
| 2009/0200568 A1 | 8/2009 | Horie |
| 2015/0280066 A1* | 10/2015 | Fujimura ................ H01L 33/24 257/98 |

FOREIGN PATENT DOCUMENTS

| TW | 200812124 A | 3/2008 |
| TW | 201034246 A | 9/2010 |

(Continued)

*Primary Examiner* — Anthony Ho
(74) *Attorney, Agent, or Firm* — ScienBiziP, P.C.

(57) ABSTRACT

A flip chip light emitting diode includes a semiconductor layer comprising an epitaxial layer an N-semiconductor layer, a light active layer and a P-semiconductor layer arranged from top to bottom in series. A first electrode mounted on the semiconductor layer. A second electrode mounted on the semiconductor layer. A insulating layer mounted on the semiconductor layer. The N-semiconductor layer protrudes away from the epitaxial layer to form a protruding portion. The light active layer and the P-semiconductor layer mounts on the protruding portion in series. The insulating layer mounts between the first electrode and the protruding portion, the light active layer, the P-semiconductor layer and the second electrode. The flip chip light emitting diode also comprises a supporting portion, the supporting portion is mounted on a top surface of the epitaxial layer by a connecting portion. The connecting portion has same or different materials with the supporting portion.

12 Claims, 16 Drawing Sheets

(51) Int. Cl.
*H01L 33/24* (2010.01)
*H01L 33/12* (2010.01)

(52) U.S. Cl.
CPC .............. *H01L 33/44* (2013.01); *H01L 33/12* (2013.01); *H01L 2933/0016* (2013.01); *H01L 2933/0025* (2013.01)

(58) Field of Classification Search
USPC .......................................................... 257/99
See application file for complete search history.

(56) References Cited

FOREIGN PATENT DOCUMENTS

| | | |
|---|---|---|
| TW | 201251119 A | 12/2012 |
| TW | 201308691 A | 2/2013 |

* cited by examiner

FLIP CHIP LIGHT EMITTING DIODE AND METHOD OF MANUFACTURING THE SAME

CROSS-REFERENCE TO RELATED APPLICATIONS

This application claims priority to Chinese Patent Application No. 201710049601.5 filed on Jan. 20, 2017, the contents of which are incorporated by reference herein.

FIELD

The subject matter herein generally relates to a light emitting diode, especially relates to a flip chip light emitting diode and method of manufacturing the same.

BACKGROUND

Light emitting diode (LED) is a semiconductor device for converting current to light with different waves. The light emitting diode widely used in light area, because the light emitting diode has advantages of high brightness, low voltage, long life, great environment protection etc.

The light emitting diode generally has a vertical type structure and flip chip type structure. The light emitting diode with the vertical type structure has a P electrode and an N electrode. The P electrode and the N electrode are mounted on different side of the light emitting diode. The light emitting diode couples with a base by wiring. Thus, electrical conductivity between the light emitting diode and the base may be poor, so the light emitting diode with the vertical type structure may have low quality.

The light emitting diode with flip chip type structure also has a P electrode and an N electrode. The flip chip light emitting diode couples with the base by the P electrode and the N electrode rather than the wiring. However, while the flip chip light emitting diode is coupled with the base, the P electrode and the N electrode of the flip chip light emitting diode position with the electrode of the base are so difficult that the P electrode and the N electrode are poorly coupled with the base.

BRIEF DESCRIPTION OF THE DRAWINGS

Implementations of the present technology will now be described, by way of example only, with reference to the attached figures.

DETAILED DESCRIPTION OF EXEMPLARY EMBODIMENTS

It will be appreciated that for simplicity and clarity of illustration, numerous specific details are set forth in order to provide a thorough understanding of the embodiments described herein. However, it will be understood by those of ordinary skill in the art that the exemplary embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the exemplary embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
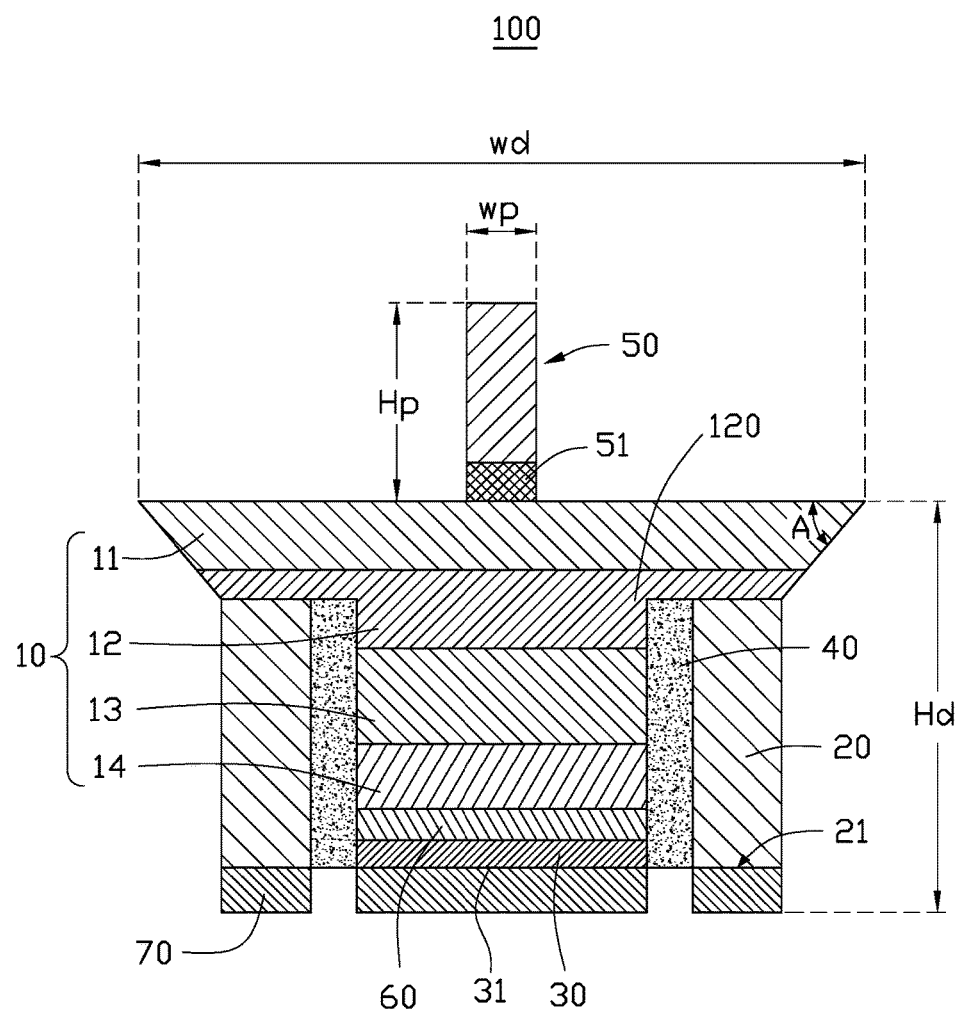
FIG. 1 is a cross-sectional view of a flip chip light emitting diode of a first exemplary embodiment of the present disclosure.

Referring to FIG. 1, a flip chip light emitting diode 100 of a first exemplary embodiment of the present disclosure can emits ultraviolet light, blue light, green light, yellow light or red light. The flip chip light emitting diode 100 includes a semiconductor layer 10, a first electrode 20 mounted on the semiconductor layer 10, a second electrode 30 mounted on the semiconductor layer 10, and a insulating layer 40 formed on the semiconductor layer 10 for insulating the first electrode 20 and the second electrode 30.

Figure 2:
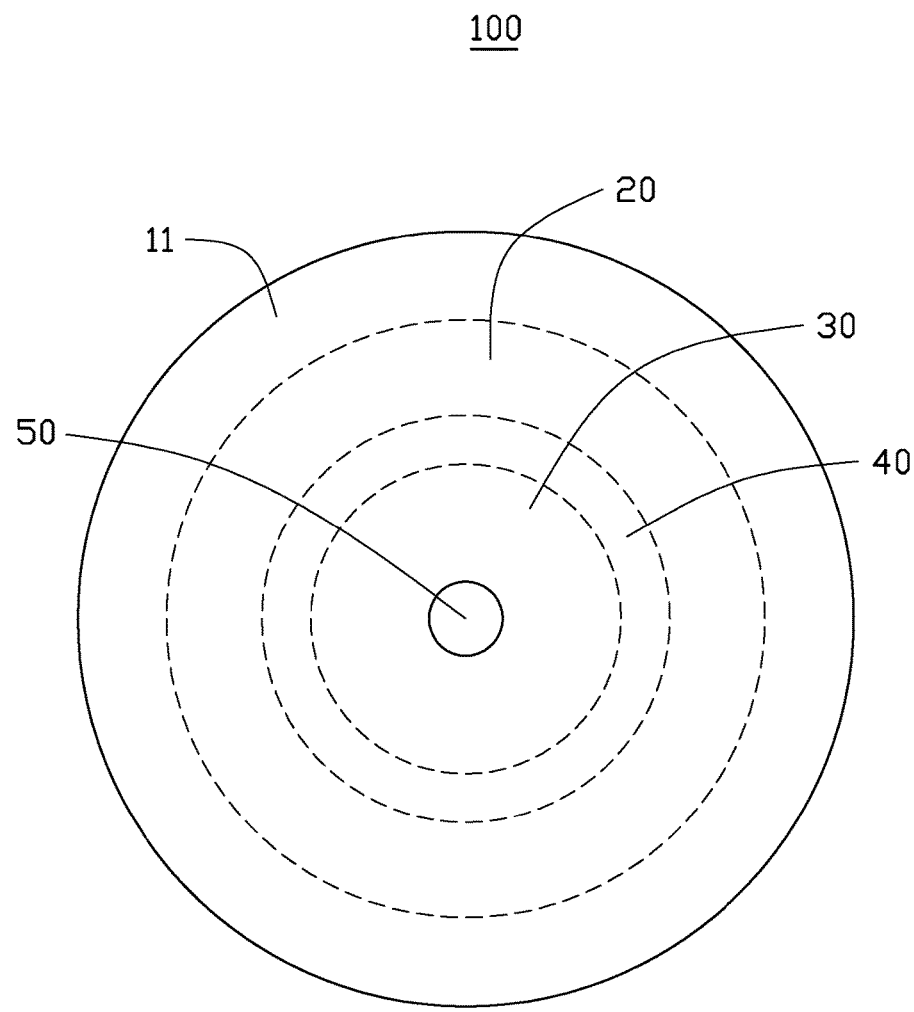
FIG. 2 is a top view of the flip chip light emitting diode of the first exemplary embodiment of the present disclosure.

Referring to FIG. 2, a top view of the flip chip light emitting diode 100 of the first exemplary embodiment is circular. It can be understand that the top view of the flip chip light emitting diode of the other exemplary embodiment may be rectangular, triangle, oval, or polygon.

Referring to FIG. 1, the semiconductor layer 10 includes an epitaxial layer 11, an N-semiconductor layer 12, a light active layer 13 and a P-semiconductor layer 14 arranged from a top to the bottom in series.

In the cross-sectional view of the light emitting diode 100 in FIG. 1, a width wd is defined as the length from one end of the semiconductor layer 10 to another end of the semiconductor layer 10. A width of the epitaxial layer 11 is greater than a width of the N-semiconductor layer 12. The width of the epitaxial layer 11 is greater than a width of the light active layer 13. The width of the epitaxial layer 11 is greater than a width of the P-semiconductor layer 14. In the first exemplary embodiment, a cross-sectional view of the epitaxial layer 11 is trapezoidal. The width of the epitaxial layer 11 gradually increases from an end adjacent to the N-semiconductor layer 12 toward an end away from the N-semiconductor layer 12. Further, the epitaxial layer 11 defines an apex angle A. A is between 30° and 80°, preferably, A is 75°.

The N-semiconductor layer 12 is mounted on a bottom surface of the epitaxial layer 11. A center portion of a bottom surface of the N-semiconductor layer 12 protrudes away from the epitaxial layer 11 to form a protruding portion 120. The light active layer 13 and the P-semiconductor layer 14 mounts on the protruding portion 120 in series.

The first electrode 20 mounts on a peripheral portion of a bottom surface of the N-semiconductor layer 12 away from the epitaxial layer 11. The first electrode 20 is spaced from the protruding portion 120. The second electrode 30 is mounted on a bottom surface of the P-semiconductor layer 14. A bottom surface 21 of the first electrode 20 and a bottom surface 31 of the second electrode 30 are on the same plane. In the first exemplary embodiment, the first electrode 20 is an N electrode, the second electrode 30 is a P electrode.

The insulating layer 40 is located between the protruding portion 120, the light active layer 13, the P-semiconductor layer 14 and the first electrode 20 as shown in FIG. 1. The insulating layer 40 is made of rubber materials, polymer materials, silicon, or SiNx.

Further, the flip chip light emitting diode 100 of the first exemplary embodiment includes a supporting portion 50. The supporting portion 50 mounts on a top surface of the epitaxial layer 11. The supporting portion 50 is made of rubber materials, polymer materials, silicon, or SiNx. The supporting portion 50 is black, white or transparent.

Further, a connecting portion 51 is mounted between the supporting portion 50 and the epitaxial layer 11 to increase a stability of the supporting portion 50. In the first exemplary embodiment, the connecting portion 51 is made of silicon. In other exemplary embodiment, the connecting portion 51 has same materials as the supporting portion 50.

Further, the flip chip light emitting diode 100 includes a conductive layer 60 mounted on between the second electrode 30 and the P-semiconductor 14. The conductive layer 60 increases the conductivity of the second electrode 30 and the P-semiconductor 14.

Further, the flip chip light emitting diode 100 includes a buffer layer 70 mounted on the first electrode 20 and the second electrode 30. The buffer layer 70 is made one or more of the Ti, Ni, Sn, In and Au.

In the first exemplary embodiment, a width of the flip chip light emitting diode 100 is defined as wd. wd is 5-200 μm, preferably wd is 40 μm. A height of the flip chip light emitting diode 100 is defined as Hd. Hd about is 0.1-40 μm, preferably, Hd about is 4.35 μm. A height of the supporting portion 50 is defines as Hp. Hp is between 0.2 μm and 40 μm, preferably, Hd is about 2 μm. A width of the supporting portion 50 is defined as wp. wp is between 0.5 μm and 40 μm, preferably, wp is about 5 μm. Further, wd/Hd (radio) is between 5 and 50. Preferably, wd/Hd is about 9.2. wp/wd (radio) is between 0.1 and 0.2. Preferably, wp/wd is about 0.13. Hp/wp is between 0.3 and 1. Preferably, Hp/wp is about 0.4.

In this exemplary embodiment, the supporting portion 50 mounts on the epitaxial layer 11. The connecting portion 51 is mounted between the supporting portion 50 and the epitaxial layer 11. So the flip chip light emitting diode 100 has good mechanical strength and assembly yield. Further, the flip chip light emitting diode 100 has defined a number of Wp, Hd, Wd, Hp. So the flip chip light emitting diode 100 has good coordination with the supporting portion 50 and quality.

Figure 3:
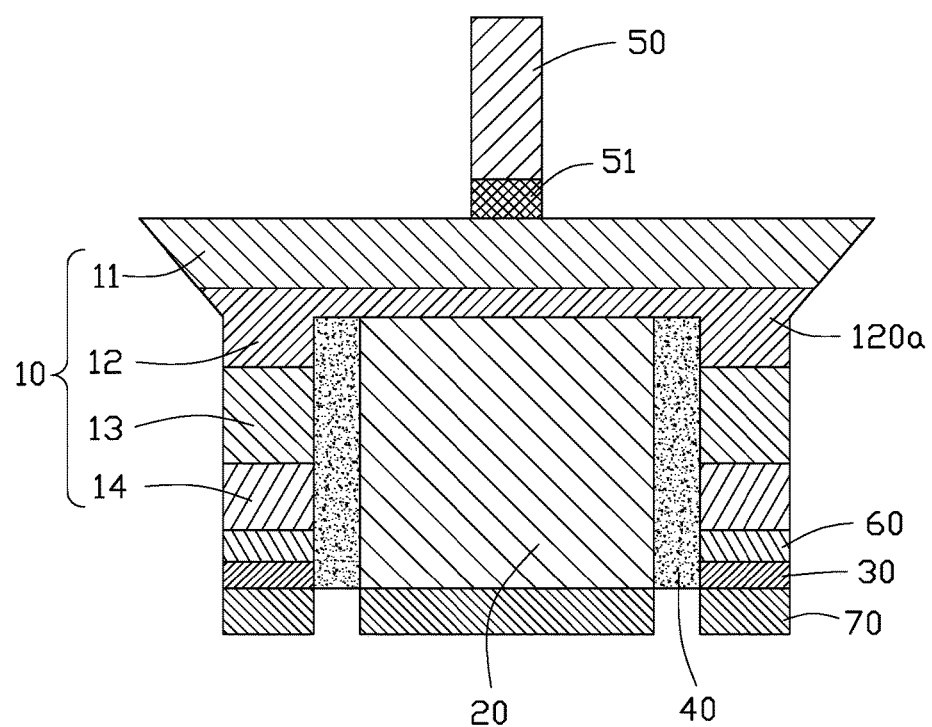
FIG. 3 is a cross-sectional view of a flip chip light emitting diode of a second exemplary embodiment of the present disclosure.
Figure 4:
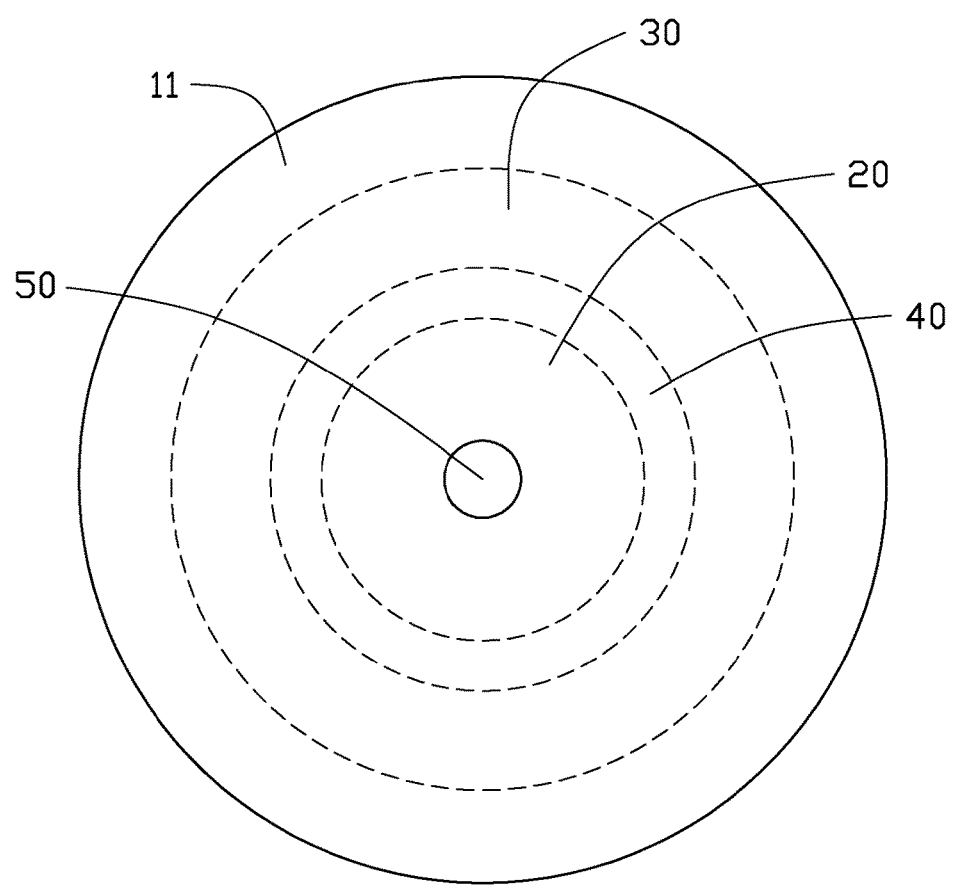
FIG. 4 is a top view of the flip chip light emitting diode of the second exemplary embodiment of the present disclosure.

Referring to FIGS. 3-4, a flip chip light emitting diode 100a of a second exemplary embodiment is similar to the flip chip light emitting diode 100 of the first exemplary embodiment, the difference is: the N-semiconductor layer 12 protrudes away from the epitaxial layer 11 to form a protruding portion 120a. The protruding portion 120a protruding from a peripheral portion of the N-semiconductor layer 12. The light active layer 13, the P-semiconductor layer 14 are mounted on the protruding portion 120a. The first electrode 20 is mounted on the center portion of the bottom surface of the N-semiconductor layer 12 away from the epitaxial layer 11. The conductive layer 60 is mounted on the P-semiconductor layer 14, and the second electrode 30 is mounted on the conductive layer 60. The insulating layer 40 is located between the protruding portion 120a, the light active layer 13, the P-semiconductor layer 14 and the first electrode 20.

In the second exemplary embodiment, the light active layer 13, the P-semiconductor layer 14 surrounds the first electrode 20. Thus, the flip chip light emitting diode 100a increases an emitting angle and a scope of emitting light.

Figure 5:
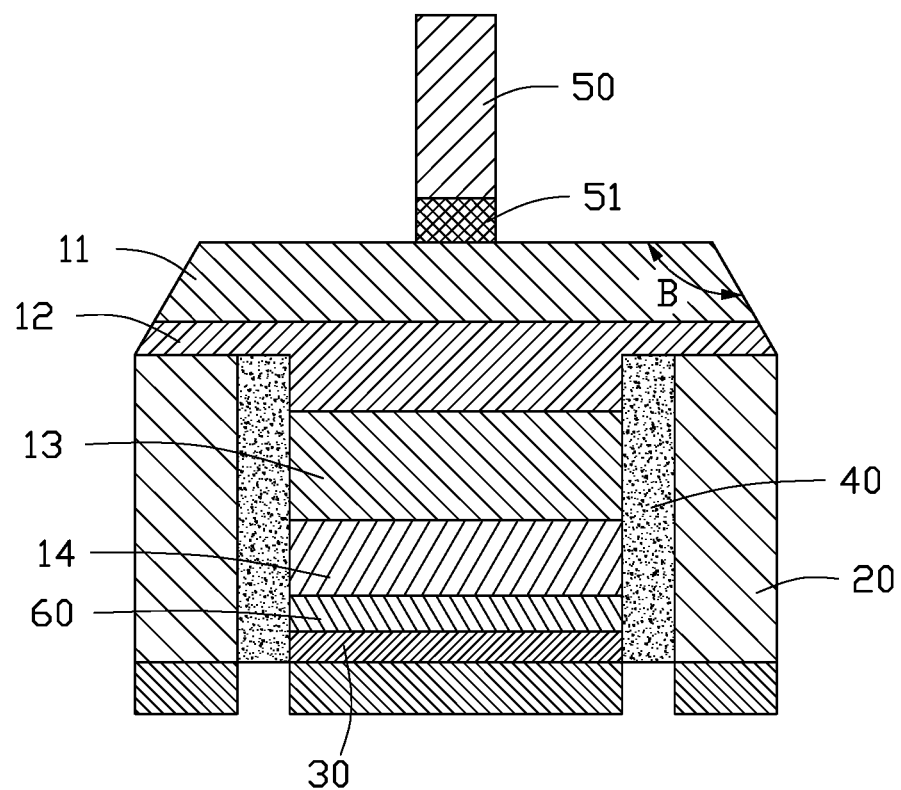
FIG. 5 is a cross-sectional view of a flip chip light emitting diode of a third exemplary embodiment of the present disclosure.

Referring to FIG. 5, a flip chip light emitting diode 100b of a third exemplary embodiment is also similar to the flip chip light emitting diode 100 of the first exemplary embodiment, the difference is: a cross-sectional section of the epitaxial layer 11 is trapezoidal. A width of the epitaxial layer 11 decreases away from the N-semiconductor layer 12. The epitaxial layer 11 has an apex angle B. B is between 100° and 150°, preferably, B is about 120°.

Figure 6:
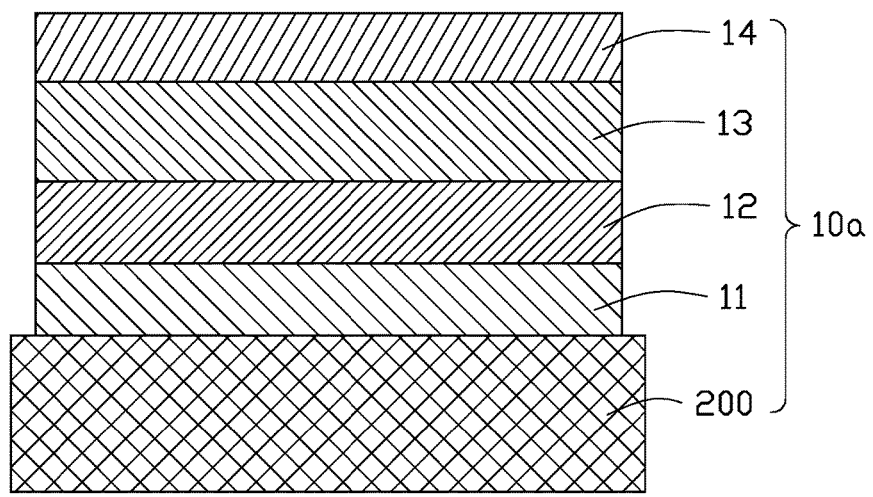
FIGS. 6-16 show a method of manufacturing the flip chip light emitting diode of the first exemplary embodiment of the present disclosure.

A method of manufacturing the flip chip light emitting diode 100 of the first exemplary embodiment includes the following steps:

First, referring to FIG. 6, providing an original semiconductor layer 10a.

The original semiconductor layer 10a includes a substrate 200, the epitaxial layer 11, the N-semiconductor layer 12, the light active layer 13 and the P-semiconductor layer 14 arranged from top to bottom in series.

Figure 7:
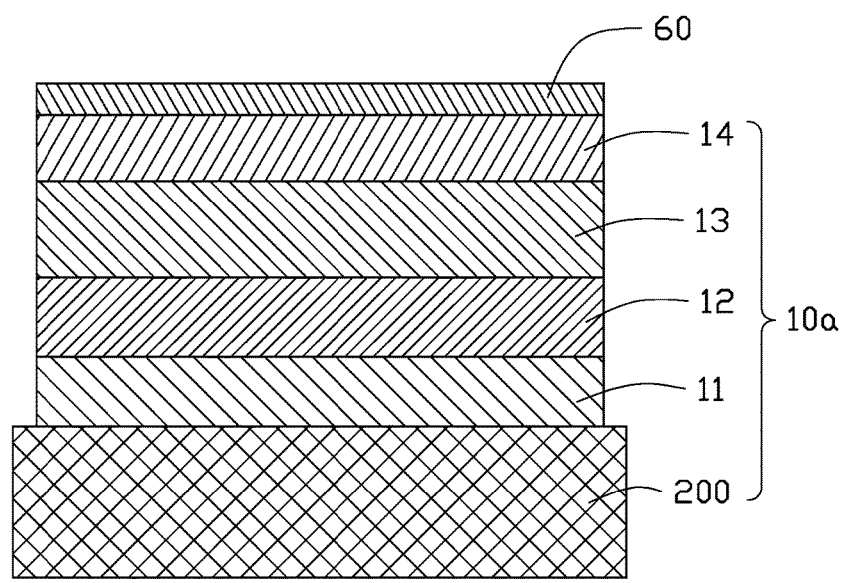

Referring to FIG. 7, forming a conductive layer 60 on the P-semiconductor layer 14.

Figure 8:
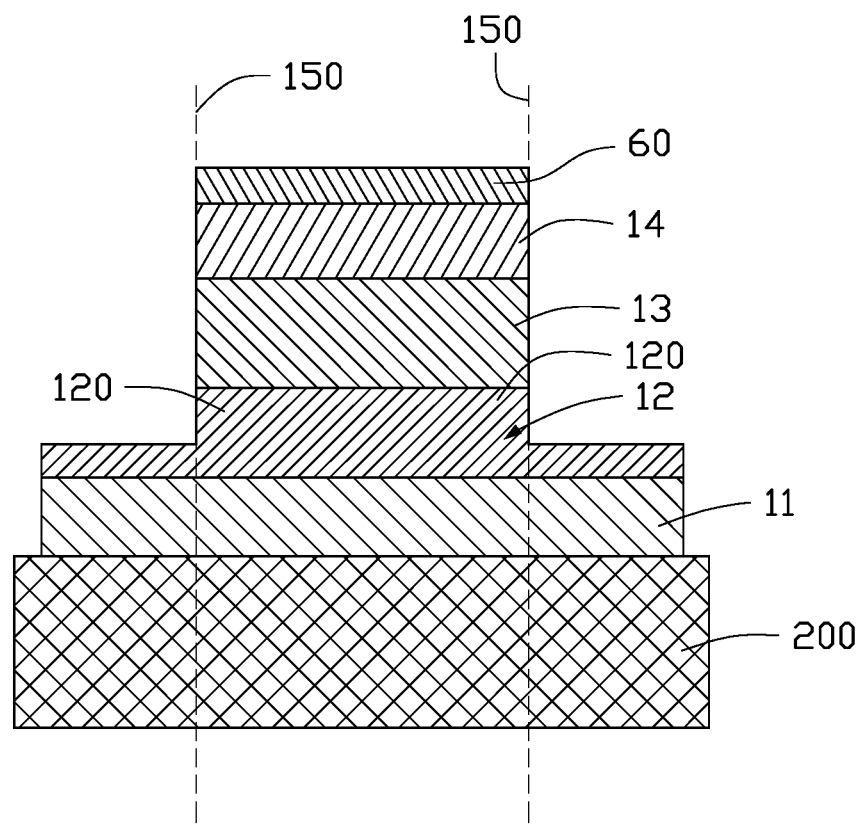

Then, etching a peripheral portion of the conductive layer 60, a peripheral portion of the P-semiconductor layer 14, a peripheral portion of the light active layer 13, a peripheral portion of the N-semiconductor layer 12 from top to bottom as shown in FIG. 8.

While etching, the original semiconductor layer 10a is T-shaped. The N-semiconductor layer 12 is etched to form a protruding portion 120 as shown in FIG. 8. The light active layer 13, the P-semiconductor layer 14 and the conductive layer 60 is arranged on the protruding portion 120 in series. The peripheral portion of the protruding portion 120, the peripheral portion of the light active layer 13, the peripheral portion of the P-semiconductor layer 14 and the peripheral portion of the conductive layer 60 are coplanar respect to an axis 150.

Figure 9:
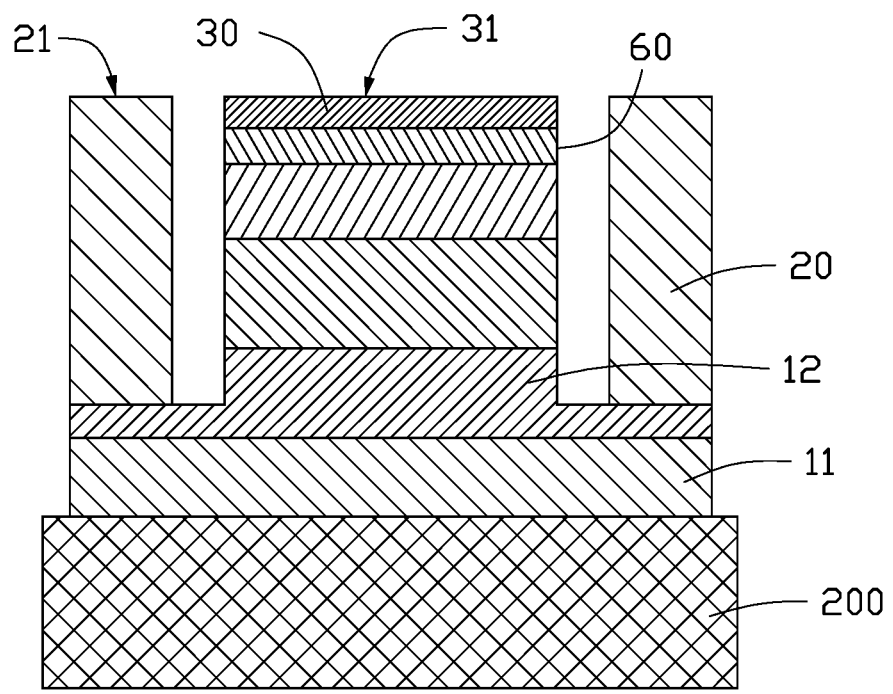

Referring to FIG. 9, forming a first electrode 20 on peripheral portions of the N-semiconductor layer 12, and forming a second electrode 30 on the conductive layer 60.

The first electrode 20 surrounds the protruding portion 120, the light active layer 13, the P-semiconductor layer 14 and the conductive layer 60. The first electrode 20 is also spaced from the protruding portion 120, the light active layer 13, the P-semiconductor layer 14 and the conductive layer 60. A height of the first electrode 20 is a sum of a height of the protruding portion 120, a height of the light active layer 13, a height of the P-semiconductor layer 14, a height of the conductive layer 60 and a height of the second electrode 30. A bottom surface 21 of the first electrode 20 and a bottom surface 31 of the second electrode 30 are coplanar.

Figure 10:
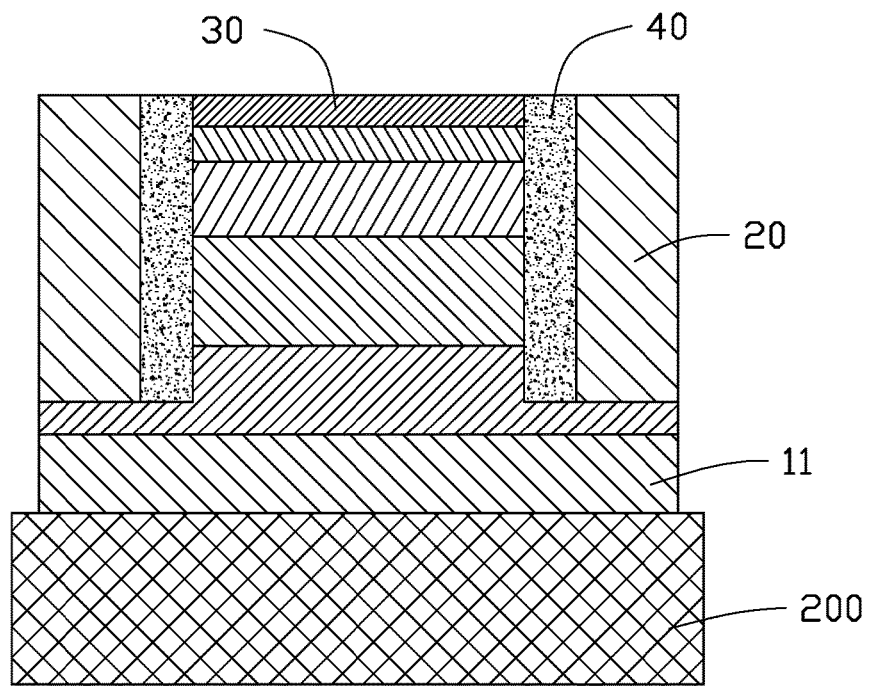

Referring to FIG. 10, filling a colloid between the protruding portion 120, the light active layer 13, the P-semiconductor layer 14, the conductive layer 60 and the first electrode 20, and curing the colloid to form an insulating layer 40.

A height of the insulating layer 40 is equal to the height of the first electrode 20.

Figure 11:
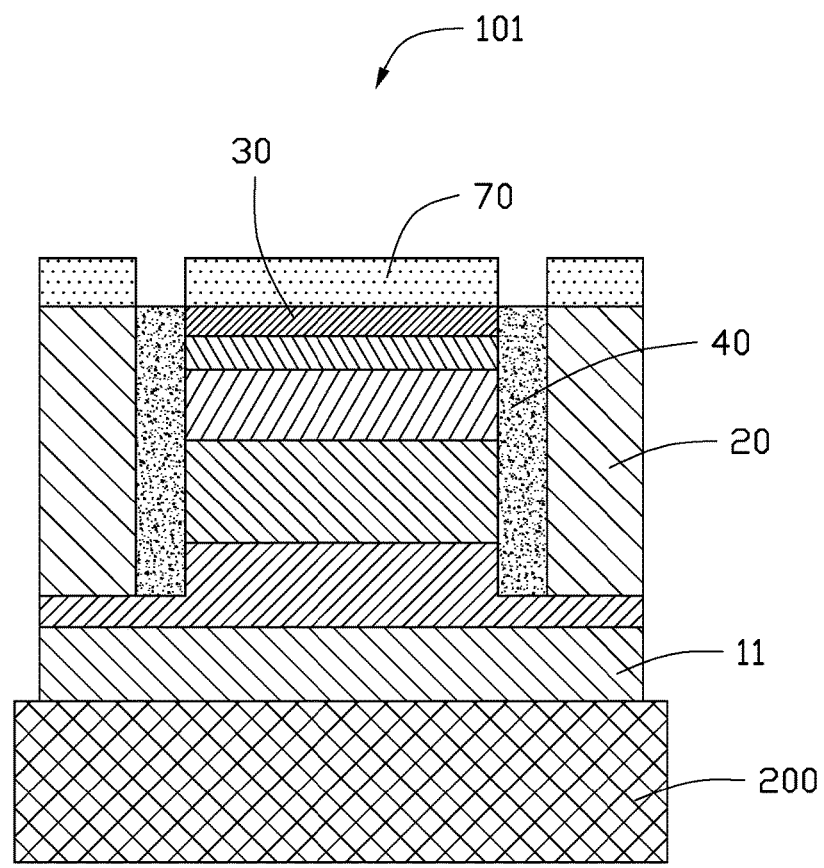

Sixth, referring to FIG. 11, forming a buffering layer 70 on the first electrode 20 and the second electrode 30 to get a original flip chip light emitting diode 101.

The buffer layer 70 is made of one or more of the following elements: Ti, Ni, Sn, In or Au.

Figure 12:
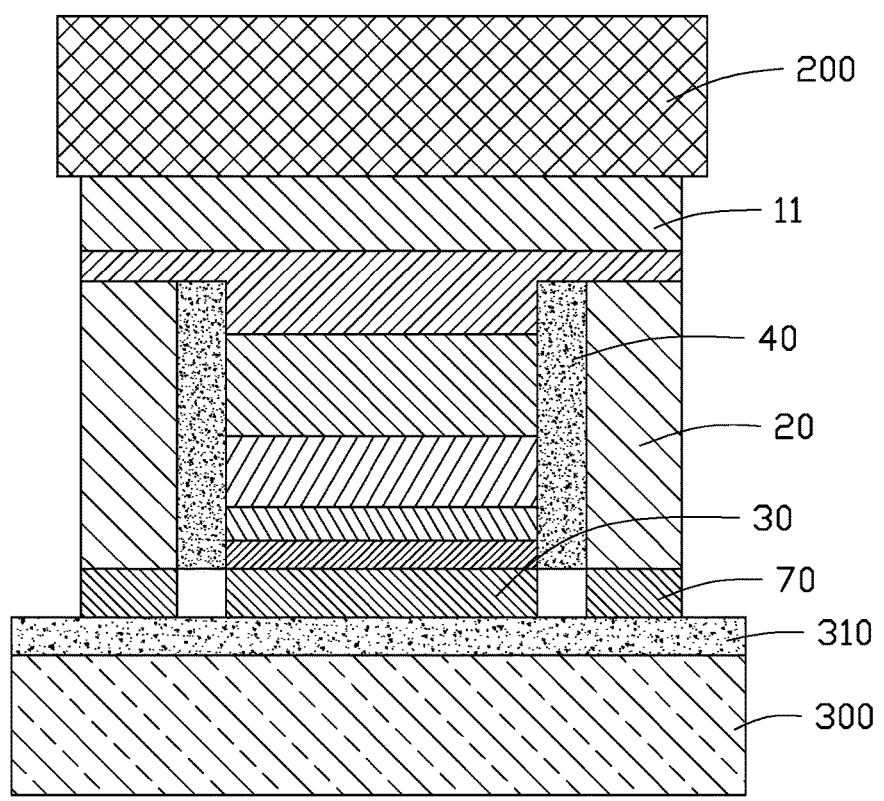

Referring to FIG. 12, providing a glass substrate 300 with an adhesive layer 310 on one surface of the glass substrate 300, then reversing the original flip chip light emitting diode 101 onto the adhesive layer 310 of the glass substrate 300.

Figure 13:
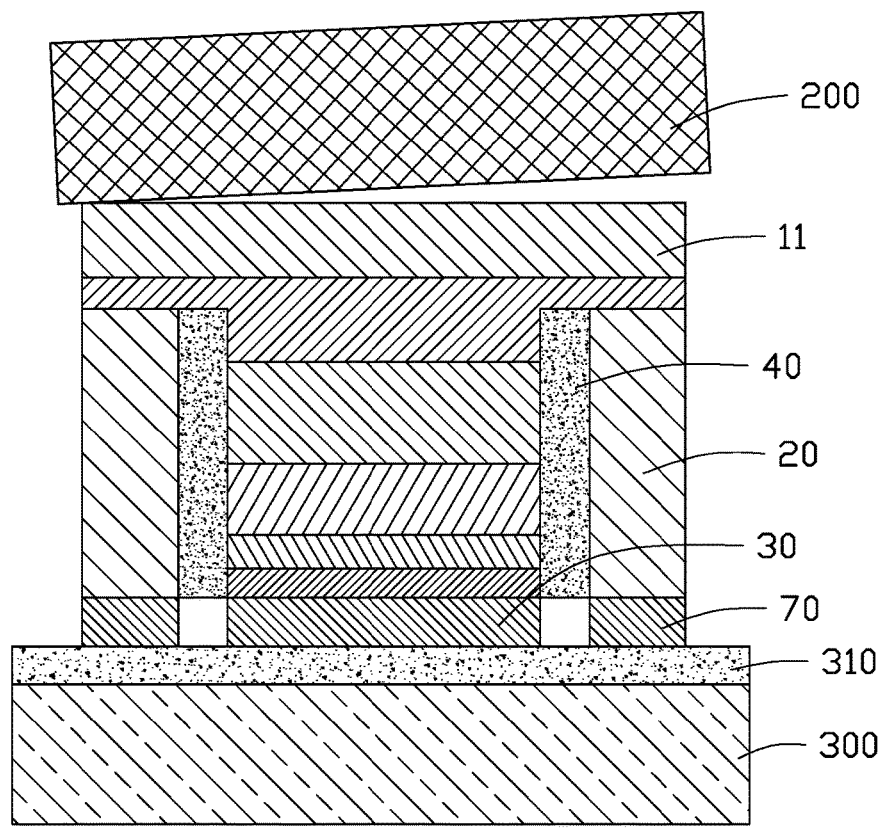

Referring to FIG. 13, separating the substrate 200 from the epitaxial layer 11 by laser.

Figure 14:
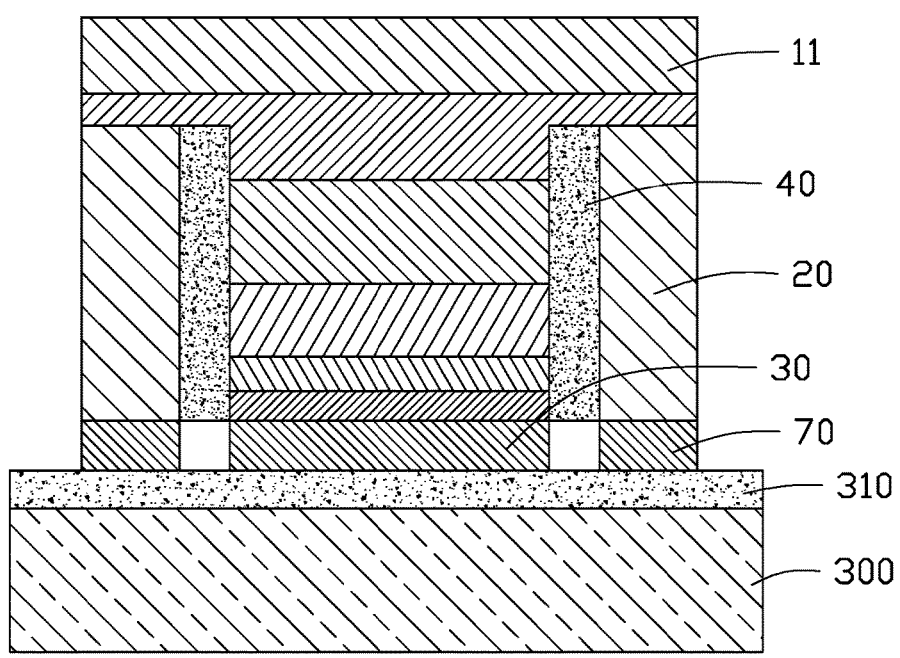

Referring to FIG. 14, removing thoroughly the substrate 200 from the epitaxial layer 11.

Figure 15:
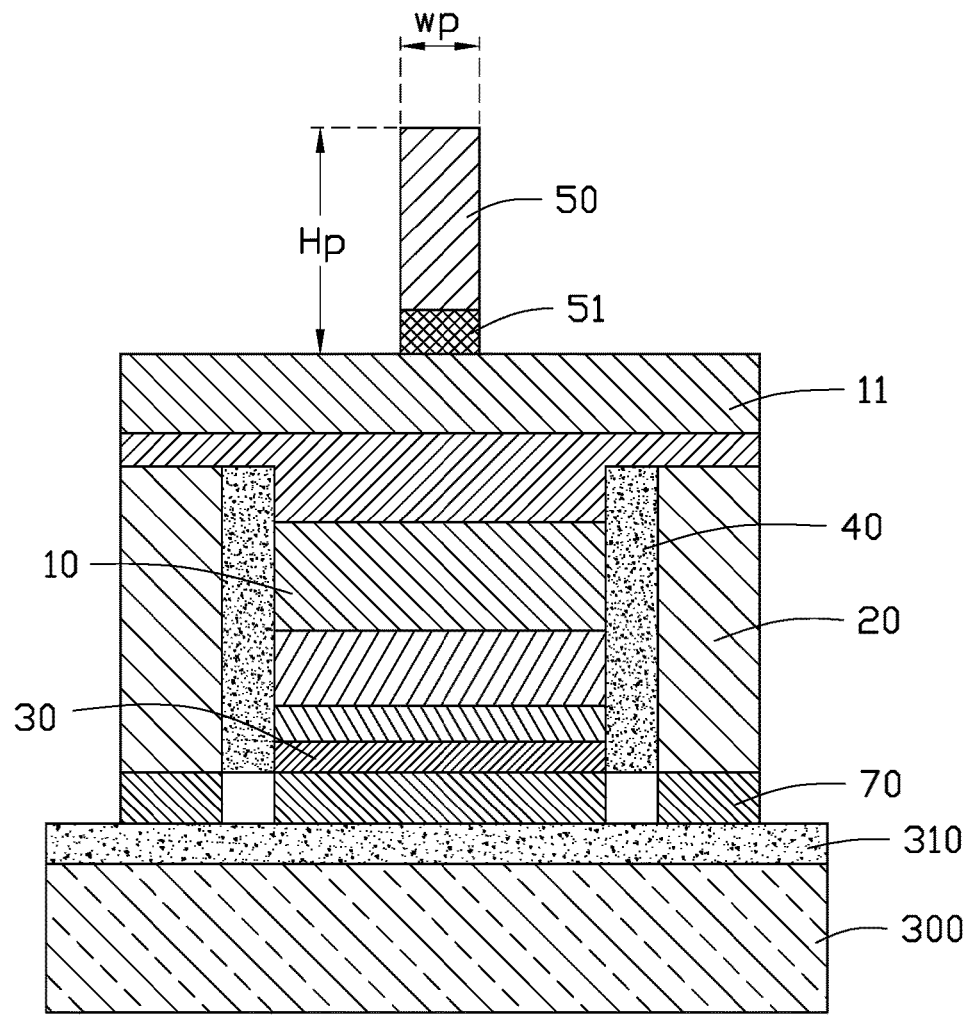

Tenth, referring to FIG. 15, forming a connecting portion 51 on the top surface of the epitaxial layer 11, and forming a supporting portion 50 on the connecting portion 51.

The supporting portion 50 is made of rubber materials, polymer materials, silicon, or SiNx. The connecting portion 51 is made of silicon. A height of the supporting portion 50 is defined as Hp. Hp is 0.2-40 μm, preferably Hd is 2 μm. A width of the supporting portion 50 is defined as wp. wp is about 0.5-40 μm, preferably Wp is about 5 μm.

Figure 16:
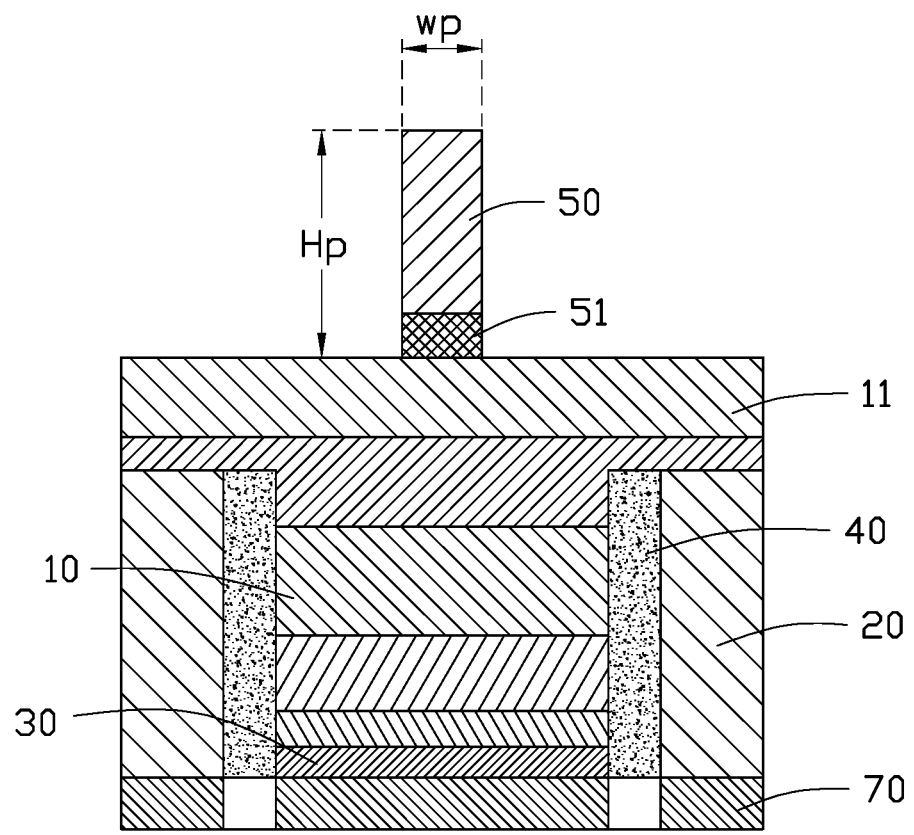

Referring to FIG. 16, removing the glass substrate 300 and the adhesive layer 310 to get the flip chip light emitting diode 100 of the first exemplary embodiment.

In method of manufacturing the flip chip light emitting diode 100, the apex angle A is formed by a way of etching epitaxial layer 11.

The exemplary embodiments shown and described above are only examples. Many details are often found in the art such as the other features of a flip chip light emitting diode and method of manufacturing the same. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the exemplary embodiments described above can be modified within the scope of the claims.

What is claimed is:

1. A flip chip light emitting diode, comprising:
   a semiconductor layer comprising an epitaxial layer an N-semiconductor layer, a light active layer and a P-semiconductor layer arranged from top to bottom in series;
   a first electrode formed on the semiconductor layer;
   a second electrode formed on the semiconductor layer;
   a insulating layer formed on the semiconductor layer;
   wherein, the N-semiconductor layer protrudes away from the epitaxial layer to form a protruding portion, the light active layer and the P-semiconductor layer configured for serial mounts on the protruding portion in series, the insulating layer mounts between the first electrode and the protruding portion, the light active layer, the P-semiconductor layer and the second electrode;
   wherein the flip chip light emitting diode comprises a supporting portion, the supporting portion is mounted on a top surface of the epitaxial layer by a connecting portion.

2. The flip chip light emitting diode of claim 1, wherein a width of the flip chip light emitting diode 100 is defined as wd, wherein wd is 5-200 μm, a height of the flip chip light emitting diode 100 is defined as Hd, wherein Hd is 0.1-40 μm, and a radio, wd/Hd is between 5 and 50.

3. The flip chip light emitting diode of claim 2, wherein a height of the supporting portion 50 is defined as Hp, wherein Hp is between 0.2 μm and 40 μm, a width of the supporting portion 50 is defined as wp, wherein wp is 0.5-40 μm, further, a radio, Hp/wp is between 0.3 and 1.

4. The flip chip light emitting diode of claim 3, wherein wp/wd is between 0.1 and 0.2.

5. The flip chip light emitting diode of claim 1, the protruding portion protrudes from a center portion of the bottom surface of the N-semiconductor layer away from the epitaxial layer, the first electrode mounts on a peripheral portion of a bottom surface of the N-semiconductor away from the epitaxial layer, the first electrode is spaced from the protruding portion.

6. The flip chip light emitting diode of claim 1, the protruding portion protrudes from the peripheral portion of the bottom surface of the N-semiconductor away from the epitaxial layer, the first electrode mounts adjacent a central portion of the bottom surface of the N-semiconductor layer away from the epitaxial layer, the first electrode is spaced from the protruding portion.

7. The flip chip light emitting diode of claim 1, wherein the epitaxial layer has a trapezoidal cross-section, the width of the epitaxial layer gradually increasing from an end adjacent to the N-semiconductor layer toward an end away from the N-semiconductor layer.

8. The flip chip light emitting diode of claim 7, wherein the epitaxial layer defines an apex angle A, A is between 30° and 80°.

9. The flip chip light emitting diode of claim 1, wherein a width of the epitaxial layer gradually decreases with an increase in distance away from the N-semiconductor layer.

10. The flip chip light emitting diode of claim 8, wherein the epitaxial layer defines an apex angle B, B is between 100° and 150°.

11. The flip chip light emitting diode of claim 1, wherein the supporting portion is made of rubber materials, polymer materials, silicon, or SiNx, the supporting portion 50 is black, white or transparent.

12. The flip chip light emitting diode of claim 1, wherein the first electrode 20 is an N electrode, and the second electrode 30 is a P electrode.

* * * * *